United States Patent [19]
Tu et al.

[11] Patent Number: 5,667,919
[45] Date of Patent: Sep. 16, 1997

[54] ATTENUATED PHASE SHIFT MASK AND METHOD OF MANUFACTURE THEREOF

[75] Inventors: Chih-Chiang Tu, Tau-yen; Jon-Yiew Gan, Chushan; Tai-Bor Wu, Hsinchu; Chin-Lung Lin, Kaohsiung, all of Taiwan

[73] Assignee: Taiwan Semiconductor Manufacturing Company, Ltd., Hsin-Chu, Taiwan

[21] Appl. No.: 682,458

[22] Filed: Jul. 17, 1996

[51] Int. Cl.$^6$ .................................................. G03F 9/00
[52] U.S. Cl. .................... 430/5; 430/322; 430/311; 428/203
[58] Field of Search ........................ 430/5, 322, 311; 427/582; 428/203, 472

[56] References Cited

U.S. PATENT DOCUMENTS

| | | | |
|---|---|---|---|
| 5,045,417 | 9/1991 | Okamoto | 430/5 |
| 5,538,816 | 7/1996 | Hashimoto et al. | 430/5 |
| 5,614,335 | 3/1997 | Hashimoto et al. | 430/5 |

OTHER PUBLICATIONS

P. Burggraaf, "Lithography's Leading Edge, Part I, Phase-Shift Technology" Semiconductor International, Feb. 1992, pp. 44–45.

*Primary Examiner*—S. Rosasco
*Attorney, Agent, or Firm*—George O. Saile; Alek P. Szecsy

[57] ABSTRACT

An attenuated Phase Shift Mask (PSM) blank and an attenuated Phase Shift Mask (PSM), and a method by which the attenuated Phase Shift Mask (PSM) blank and the attenuated Phase Shift Mask (PSM) may be formed. To form the attenuated Phase Shift Mask (PSM) blank there is first provided a transparent substrate. Formed upon the transparent substrate is a tantalum-silicon oxide blanket semi-transparent shifter layer which has the formula, $$Ta_xSi_yO_{1-x-y}$$

wherein $0.1<x<0.3$ and $0.03<y<0.1$. To form the attenuated Phase Shift Mask (PSM) from the attenuated Phase Shift Mask (PSM) blank, the tantalum-silicon oxide blanket semi-transparent shifter layer is patterned to form a tantalum-silicon oxide patterned semi-transparent shifter layer.

18 Claims, 6 Drawing Sheets

ATTENUATED PHASE SHIFT MASK AND METHOD OF MANUFACTURE THEREOF

BACKGROUND OF THE INVENTION

1. Field of the Invention

The present invention relates generally to Phase Shift Masks (PSMs) for use within semiconductor manufacturing. More particularly, the present invention relates to methods and materials for manufacturing attenuated Phase Shift Mask (PSM) blanks and attenuated Phase Shift Masks (PSMs) which are readily inspected and optically aligned.

2. Description of the Related Art

Advances in semiconductor integrated circuit performance have traditionally derived from the simultaneous continuing decreases in integrated circuit device dimensions and the correlating decreases in dimensions of conductor elements which connect those integrated circuit devices. In order to optimally produce advanced integrated circuits having these decreased dimensions, it has traditionally been required that the wavelength of coherent light employed in photolithographic processes by which integrated circuit devices and conductor elements are fabricated be substantially smaller than the minimum dimension within the reticle through which those integrated circuit devices and conductor elements are printed. As the dimension of the smallest dimension within the reticle through which integrated circuit devices and conductor elements are printed approaches the wavelength of coherent light employed to print those integrated circuit devices and conductor elements, the resolution, exposure latitude and depth of focus of the printed device or element decreases due to aberrational effects of coherent light passing through openings of width similar to the wavelength of the coherent light.

Therefore, as semiconductor technology has advanced, there has traditionally been a corresponding decrease in wavelength of light employed in printing the features of integrated circuit devices and conductor elements. Presently, light sources employed in printing the features of integrated circuit devices and conductor elements of sub-micron geometries are in the visible and Near Ultra-Violet (NUV) wavelength regions. For integrated circuit device features and conductor element features in the sub-half micron range, light sources in the Deep Ultra-Violet (DUV) and x-ray wavelength regions have been proposed.

As an alternative approach for providing high resolution printed integrated circuit devices and conductor elements of dimensions similar to the wavelength of coherent light by which those integrated circuit devices and conductor elements are printed, there has recently been proposed the use of Phase Shift Masks (PSMs) in place of conventional reticles. In comparison with conventional reticles, Phase Shift Masks (PSMs) typically incorporate an additional layer, usually patterned, within the conventional chrome metal-on-glass reticle construction. The additional layer, which is commonly referred to as a shifter layer, has a thickness related to the wavelength of coherent light passing through the Phase Shift Mask (PSM). The differences in optical properties between conventional reticles and Phase Shift Masks (PSMs) derive from the differences in light paths passing through: (1) the transparent substrate which is employed in both a conventional reticle and a Phase Shift Mask (PSM), and (2) the shifter layer which is employed only within a Phase Shift Mask (PSM). Coherent light rays passing through the transparent substrate and the shifter layer have different optical path lengths and thus emerge from those surfaces with different phases. The interference effects of the coherent light rays of different phase provided by a Phase Shift Mask (PSM) form a higher resolution image when projected onto a semiconductor substrate, which higher resolution image has a greater depth of focus and a greater exposure latitude.

Typical constructions of a conventional reticle and a conventional Phase Shift Mask (PSM), along with light intensities and light amplitudes achieved with those constructions, are illustrated in FIG. 1 to FIG. 8. FIG. 1 illustrates a conventional reticle constructed from a transparent substrate 10 and a patterned metal layer 12, along with coherent light rays 14 incident upon the transparent substrate 10. FIG. 2 illustrates the light amplitude immediately after transmission of the coherent light rays 14 through the conventional reticle illustrated in FIG. 1. FIG. 3 illustrates the light amplitude on a substrate surface upon which is printed through a projection or similar process the pattern of the conventional reticle illustrated in FIG. 1. FIG. 4 illustrates the light intensity on the substrate surface corresponding to the light amplitude on the substrate surface illustrated in FIG. 3.

In comparison with the conventional reticle illustrated in FIG. 1, FIG. 5 illustrates a conventional Phase Shift Mask (PSM) which has a patterned transparent shifter layer 16 occupying alternating light transmitting regions of the patterned metal layer 12. The light amplitude and light intensity graphs of FIG. 6 to FIG. 8 correspond respectively to the light amplitude and light intensity graphs of FIG. 2 to FIG. 4. The resolution, depth of focus and exposure latitude of the light intensity achievable with the conventional Phase Shift Mask (PSM), as illustrated in FIG. 8, is dramatic in comparison with the corresponding resolution, depth of focus and exposure latitude achievable under equivalent illumination conditions with the conventional reticle, as illustrated in FIG. 4.

There are various locations where a transparent shifter layer may be incorporated within a conventional reticle to provide a conventional Phase Shift Mask (PSM). For example, P. Burggraaf in "Lithography's Leading Edge, Part I: Phase-shift Technology," Semiconductor International, February 1992, pp 44–45 discloses several conventional Phase Shift Mask (PSM) constructions where a blanket or patterned transparent shifter layer is incorporated either above or below the patterned metal layer in a conventional reticle construction. In addition, Okamoto, in U.S. Pat. No. 5,045,417 discloses several additional Phase Shift Mask (PSM) constructions, some of which incorporate a series of grooves formed within light transmitting regions of a conventional reticle substrate, which grooves serve a patterned transparent shifter layer function without the need for an additional patterned transparent shifter layer.

One of the more unique Phase Shift Mask (PSM) constructions is the attenuated Phase Shift Mask (PSM). The attenuated Phase Shift Mask (PSM) enhances the resolution, depth of focus and exposure latitude of the dark areas to be printed. A cross sectional diagram illustrating an attenuated Phase Shift Mask (PSM) construction, along with its corresponding light amplitude and light intensity graphs, is illustrated in FIG. 9 to FIG. 12. As shown in FIG. 9, the attenuated Phase Shift Mask (PSM) has formed upon a transparent substrate 10 a patterned semi-transparent shifter layer 18. The patterned semi-transparent shifter layer 18 is typically formed of an oxidized metal layer which provides a 180 degree phase shift to the coherent light rays 14. The thickness of the patterns within the patterned semi-transparent shifter layer 18 is defined by the equation:

$$d = \lambda/2(n-1)$$

where d equals the thickness of the patterns within the patterned semi-transparent shifter layer 18, $\lambda$ equals the wavelength of the coherent light rays 14 and n equals the index of refraction of the material from which is formed the patterned semi-transparent shifter layer 18.

Although Phase Shift Masks (PSMs) provide substantial potential for cost avoidance with regard to the need for new generations of semiconductor photolithographic processing equipment, the manufacturing of Phase Shift Mask (PSM) blanks and Phase Shift Masks (PSMs) is not entirely without problems.

For example, the semi-transparent shifter layers found within attenuated Phase Shift Mask (PSM) blanks and attenuated Phase Shift Masks (PSMs) are often formed of materials having properties such that optical inspection, alignment and repair of those attenuated Phase Shift Mask (PSM) blanks and attenuated Phase Shift Masks (PSMs) is often accomplished only with difficulty. In particular, while it is common in the art that attenuated Phase Shift Masks (PSMs) will be employed with exposure wavelengths corresponding to the Near Ultra-Violet (NUV) (i.e.: 365 nm) region and the Deep Ultra-Violet (DUV) (i.e.: 248 nm) region, it is also common in the art that the alignment and inspection of those attenuated Phase Shift Masks (PSMs) and attenuated Phase Shift Mask (PSM) blanks from which are formed those attenuated Phase Shift Masks (PSMs) will occur with Helium-Neon laser light at 623 nm.

Thus, although there may exist many materials from which may be formed blanket semi-transparent shifter layers within attenuated Phase Shift Mask (PSM) blanks and patterned semi-transparent shifter layers within attenuated Phase Shift Masks (PSMs), either of which are operational at either the Near Ultra-Violet (NUV) (i.e.: 365 nm) exposure region or the Deep Ultra-Violet (DUV) (i.e.: 248 nm) exposure region, such materials will often not simultaneously possess the desired optical properties at the 623 nm Helium-Neon laser light inspection and alignment wavelength region. In particular, it is often found that materials from which may be formed blanket and patterned semi-transparent shifter layers in attenuated Phase Shift Mask (PSM) blanks and attenuated Phase Shift Masks (PSMs) operational in the Near Ultra-Violet (NUV) (i.e.: 365 nm) and the Deep Ultra-Violet (DUV) (i.e.: 248 nm) wavelength regions will often have an undesirably high light transmission at the 623 nm Helium-Neon laser light wavelength which is employed to optically inspect and align those attenuated Phase Shift Mask (PSM) blanks and attenuated Phase Shift Masks (PSMs).

Thus, it is desirable in the art to provide attenuated Phase Shift Mask (PSM) blanks and attenuated Phase Shift Masks (PSMs) whose constructions are fully operational at Near Ultra-Violet (NUV) (i.e.: 365 nm) or Deep Ultra-Violet (DUV) (i.e.: 248 nm) exposure wavelengths and simultaneously readily inspected and aligned with Helium-Neon laser light at 623 nm. It is towards this goal that the present invention is directed.

SUMMARY OF THE INVENTION

A first object of the present invention is to provide an attenuated Phase Shift Mask (PSM) blank operational at the Near Ultra-Violet (NUV) (i.e.: 365 nm) or Deep Ultra-Violet (DUV) (i.e.: 248 nm) wavelength region, which attenuated Phase Shift Mask (PSM) blank is simultaneously easily inspected and aligned with Helium-Neon laser light at 623 nm.

A second object of the present invention is to provide an attenuated Phase Shift Mask (PSM) operational at the Near Ultra-Violet (NUV) (i.e.: 365 nm) or the Deep Ultra-Violet (DUV) (i.e.: 248 nm) wavelength region, which attenuated Phase Shift Mask (PSM) is simultaneously easily inspected and aligned with Helium-Neon laser light at 623 nm.

A third object of the present invention is to provide a readily manufacturable method for forming an attenuated Phase Shift Mask (PSM) blank or an attenuated Phase Shift Mask (PSM) in accord with the first object of the present invention or the second object of the present invention.

In accord with the objects of the present invention, a new attenuated Phase Shift Mask (PSM) blank and attenuated Phase Shift Mask (PSM) is disclosed along with a method by which the new attenuated Phase Shift Mask (PSM) blank or attenuated Phase Shift Mask (PSM) may be manufactured. To form the attenuated Phase Shift Mask (PSM) blank of the present invention, there is first provided a transparent substrate. Upon the transparent substrate is formed a tantalum-silicon oxide blanket semi-transparent shifter layer of formula,

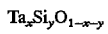

wherein $0.1<x<0.3$ and $0.03<y<0.1$. To form an attenuated Phase Shift Mask (PSM) from the attenuated Phase Shift Mask (PSM) blank of the present invention, the tantalum-silicon oxide blanket semi-transparent shifter layer is patterned to yield a tantalum-silicon oxide patterned semi-transparent shifter layer.

The attenuated Phase Shift Mask (PSM) blank and the attenuated Phase Shift Mask (PSM) of the present invention are operational in the Near Ultra-Violet (NUV) (i.e.: 365 nm) and the Deep Ultra-Violet (DUV) (i.e.: 248 nm) wavelength regions and simultaneously easily inspected and aligned with Helium-Neon laser light at a wavelength of 623 nm. The tantalum-silicon oxide blanket semi-transparent shifter layer within the attenuated Phase Shift Mask (PSM) blank and the tantalum-silicon oxide patterned semi-transparent shifter layer within the attenuated Phase Shift Mask (PSM) of the present invention have the appropriate optical properties with respect to refractive index, extinction coefficient, light transmission and light reflectance for proper operation at the Near Ultra-Violet (NUV) (i.e.: 365 nm) and the Deep Ultra-Violet (DUV) (i.e.: 248 nm) wavelength regions while simultaneously possessing a sufficiently low light transmission at 623 nm to easily allow for inspection and alignment of the attenuated Phase Shift Mask (PSM) blank or the attenuated Phase Shift Mask (PSM) with Helium-Neon laser light at 623 nm.

The attenuated Phase Shift Mask (PSM) blank and the attenuated Phase Shift Mask (PSM) of the present invention are readily manufacturable. The tantalum-silicon oxide blanket semi-transparent shifter layer within the attenuated Phase Shift Mask (PSM) blank and the tantalum-silicon oxide patterned semi-transparent shifter layer within the attenuated Phase Shift Mask (PSM) of the present invention may be formed through deposition methods and patterning methods as are otherwise generally known in the art of integrated circuit fabrication and integrated circuit reticle fabrication. Thus, methods by which may be formed the attenuated Phase Shift Mask (PSM) blank and the attenuated Phase Shift Mask (PSM) of the present invention are readily manufacturable.

BRIEF DESCRIPTION OF THE DRAWINGS

The accompanying drawings, which form a material part of this disclosure, show the following.

DESCRIPTION OF THE PREFERRED EMBODIMENTS

The present invention provides an attenuated Phase Shift Mask (PSM) blank and an attenuated Phase Shift Mask (PSM) which may be employed in photolithographic exposures in the Near Ultra-Violet (NUV) (i.e.: 365 nm) wavelength region or the Deep Ultra-Violet (DUV) (i.e.: 254 nm) wavelength region, while simultaneously being readily inspected and aligned with Helium-Neon laser light at 623 nm. The attenuated Phase Shift Mask (PSM) blank of the present invention is employed in manufacturing the attenuated Phase Shift Mask (PSM) of the present invention. The attenuated Phase Shift Mask (PSM) of the present invention, which is employed in photolithographic exposures in the Near Ultra-Violet (NUV) (i.e.: 365 nm) wavelength region or the Deep Ultra-Violet (DUV) (i.e.: 254 nm) wavelength region, may be employed in forming fine line-width integrated circuit devices and fine line-width integrated circuit conductors within many types of integrated circuits.

The attenuated Phase Shift Mask (PSM) of the present invention may be employed in forming fine line-width integrated circuit devices and fine line-width integrated circuit conductors within integrated circuits including but not limited Dynamic Random Access Memory (DRAM) integrated circuits, Static Random Access Memory (SRAM) integrated circuits, Application Specific Integrated Circuits (ASICs), integrated circuits having within their fabrications Field Effect Transistors (FETs), integrated circuits having within their fabrications bipolar transistors and integrated circuits having within their fabrications Bipolar-Complementary Metal Oxide Semiconductor (Bi-CMOS) transistors. The attenuated Phase Shift Mask (PSM) of the present invention has broad applicability within integrated circuit manufacture.

Figure 1:
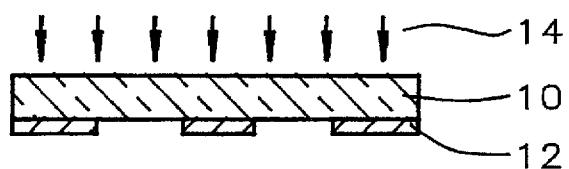
FIG. 1 illustrates a cross-sectional diagram of a conventional reticle of the prior art.
Figure 2:
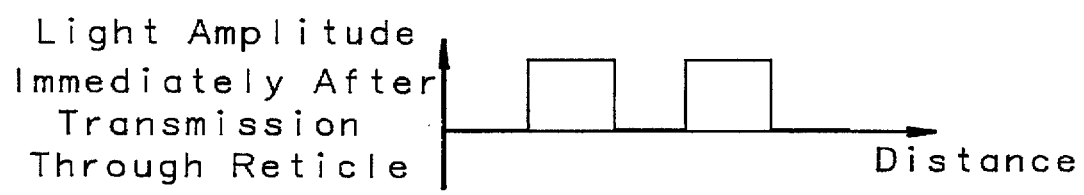
FIG. 2 to FIG. 4 illustrate a series of light amplitude and light intensity graphs corresponding to coherent light passing through the conventional reticle of FIG. 1.
Figure 3:
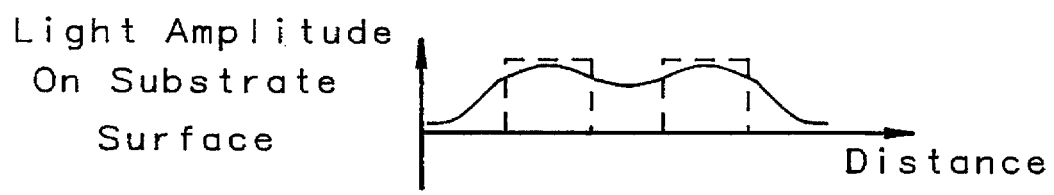
Figure 4:
Figure 5:
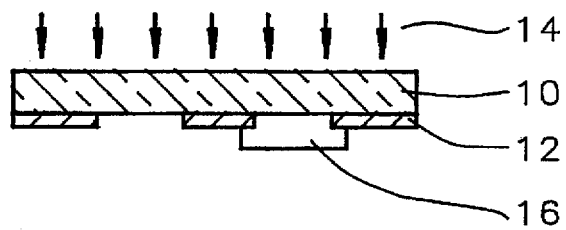
FIG. 5 illustrates a cross-sectional diagram of a conventional Phase Shift Mask (PSM) of the prior art.
Figure 6:
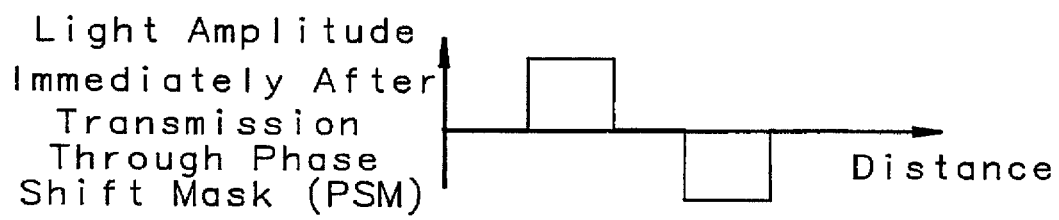
FIG. 6 to FIG. 8 illustrate a series of light amplitude and light intensity graphs corresponding to coherent light passing through the conventional Phase Shift Mask (PSM) of FIG. 5.
Figure 7:
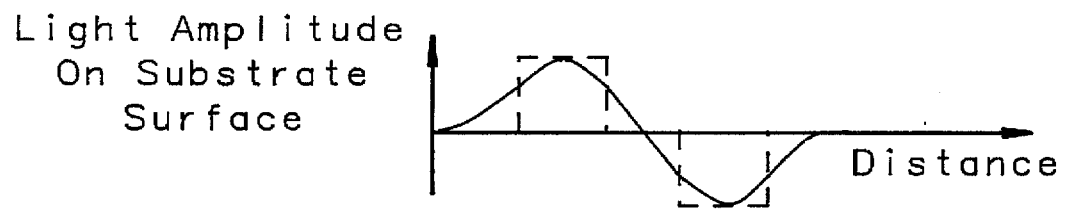
Figure 8:
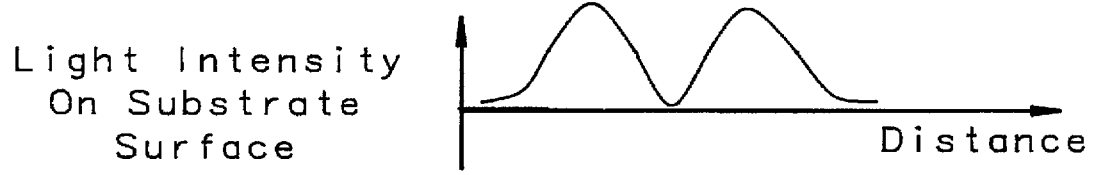
Figure 9:
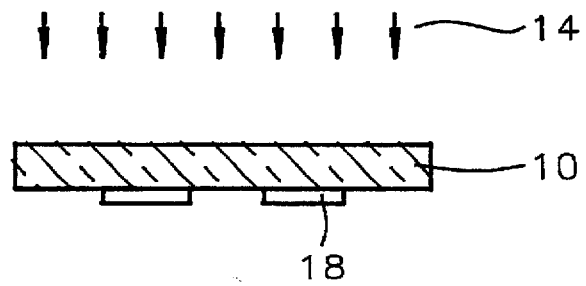
FIG. 9 illustrates a cross-sectional diagram of an attenuated Phase Shift Mask (PSM) of the prior art.
Figure 10:
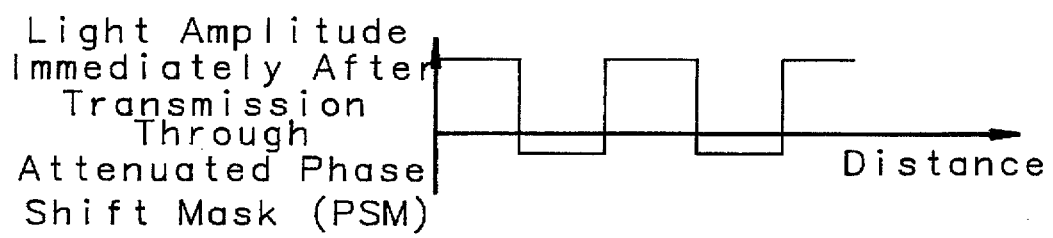
FIG. 10 to FIG. 12 illustrate a series of light amplitude and light intensity graphs corresponding to coherent light passing through the attenuated Phase Shift Mask (PSM) of FIG. 9.
Figure 11:
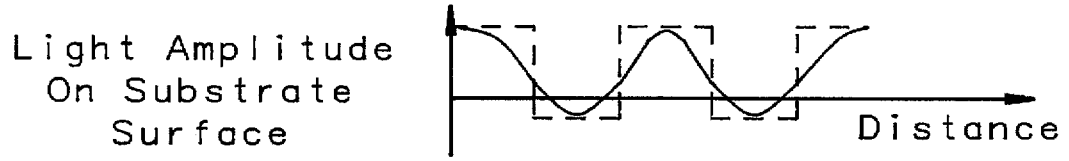
Figure 12:
Figure 13:
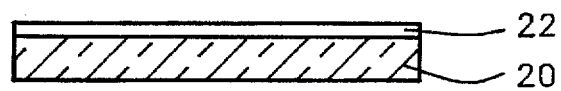
FIG. 13 and FIG. 14 illustrate a pair of cross-sectional diagrams illustrating progressive stages in forming the attenuated Phase Shift Mask (PSM) blank and the attenuated Phase Shift Mask (PSM) of the preferred embodiments of the present invention.
Figure 14:
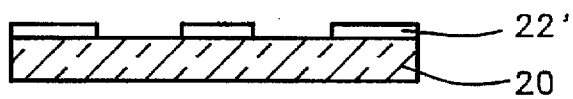

Referring now to FIG. 13 and FIG. 14 there is shown a pair of cross-sectional diagrams illustrating progressive stages in forming the attenuated Phase Shift Mask (PSM) blank and the attenuated Phase Shift Mask (PSM) of the preferred embodiments of the present invention. The cross-sectional diagram of FIG. 13 illustrates the attenuated Phase Shift Mask (PSM) blank of the preferred embodiments of the present invention.

Shown in FIG. 13 is a transparent substrate 20 upon which is formed a blanket semi-transparent shifter layer 22. The transparent substrate 20 which comprises in part the attenuated Phase Shift Mask (PSM) blank of the preferred embodiments of the present invention is comprised of a material which is transparent to the wavelength of light which will be employed to print the patterns of the attenuated Phase Shift Mask (PSM) which is formed from the attenuated Phase Shift Mask (PSM) blank of the preferred embodiments of the present invention. Thus the transparent substrate 20 will need to be transparent to light in the Near Ultra-Violet (NUV) (i.e.: 365) and the Deep Ultra-Violet (DUV) (i.e.: 248 nm) wavelength regions. For the preferred embodiments of the present invention, the transparent substrate 20 is typically formed form a glass, preferably a fused quartz glass. Preferably, the transparent substrate 20 formed from the fused quartz glass is from about 0.09 to about 0.25 inches thick.

With regard to the blanket semi-transparent shifter layer 22, it has been found from theoretical calculations that an attenuated Phase Shift Mask (PSM) blank and an attenuated Phase Shift Mask (PSM) of the preferred embodiments of the present invention may be obtained when certain optical parameters of the blanket semi-transparent shifter layer 22 fall within certain ranges with respect to Near Ultra-Violet (NUV) (i.e.: 365 nm) or Deep Ultra-Violet (DUV) (i.e.: 248 nm) wavelength light, while the blanket semi-transparent shifter layer 22 simultaneously has a light transmission of less than about 20 percent with respect to Helium-Neon laser light at 623 nm. Those optical parameters of the blanket semi-transparent shifter layer 22 with respect to Near Ultra-Violet (NUV) (i.e.: 365 nm) and Deep Ultra-Violet (DUV) (i.e.: 248 nm) wavelength light, and their associated ranges, are as follows: (1) refractive index in the range of about 1.9 to about 2.3, (2) extinction coefficient in the range of about 0.35 to about 0.55, (3) light transmittance in the range of about 3 percent to about 12 percent, and (4) light reflectance of less than about 20 percent.

It has been found experimentally that the ranges for the above four optical parameters may be met with respect to Near Ultra-Violet (NUV) (i.e.: 365 nm) and Deep Ultra-Violet (DUV) (i.e.: 248 nm) wavelength light while simultaneously providing a blanket semi-transparent shifter layer 22 having a light transmittance of less than about 20 percent with respect to Helium-Neon laser light at 623 nm by forming the blanket semi-transparent shifter layer 22 from a tantalum-silicon oxide of the formula,

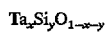

$Ta_xSi_yO_{1-x-y}$ wherein $0.1<x<0.3$ and $0.03<y<0.1$.

For an attenuated Phase Shift Mask (PSM) which is employed in Near Ultra-Violet (NUV) (i.e.: 365 nm) wavelength exposure, the blanket semi-transparent shifter layer 22 is preferably from about 1600 to about 2000 angstroms thick. For an attenuated Phase Shift Mask (PSM) employed in Deep Ultra-Violet (DUV) (i.e.: 248 nm) wavelength exposure, the blanket semi-transparent shifter layer 22 is preferably from about 1000 to about 1400 angstroms thick.

Methods and materials through which metals, metal oxides and silicon oxides may be formed upon either semiconductor substrates or transparent substrates are known in the art. Metals, metal oxides and silicon oxides may be formed upon semiconductor substrates or transparent substrates through methods including but not limited to thermal evaporation methods, Chemical Vapor Deposition (CVD) methods and Physical Vapor Deposition (PVD) sputtering methods. While any of several methods may be employed in forming the tantalum-silicon oxide blanket semi-transparent shifter layer 22 of the preferred embodiments of the present invention, it is preferred that the tantalum-silicon oxide blanket semi-transparent shifter layer 22 of the preferred embodiments of the present invention is formed through a method involving co-sputtering of tantalum and silicon upon the surface of the transparent substrate 20 in the presence of an oxygen containing atmosphere.

Preferably, the tantalum is sputtered from a tantalum target at a sputter gun power of less than about 100 watts and the silicon is sputtered from a mono-crystalline or polycrystalline silicon target, also at a power of less than about 100 watts. Preferably, the reactor chamber within which the tantalum and the silicon are sputtered to form the tantalum-silicon oxide blanket semi-transparent shifter layer 22 of the present invention is maintained at a pressure of less than about 100 mTorr. Finally, the reactor chamber within which the tantalum and the silicon are sputtered to form the tantalum-silicon oxide blanket semi-transparent shifter layer 22 of the present invention preferably has an argon gas flow rate and an oxygen gas flow rate of less than about 200 standard cubic centimeters per minute (sccm) total, with an oxygen gas flow rate of preferably less than about 10 standard cubic centimeters per minute (sccm).

Upon forming the tantalum-silicon oxide blanket semi-transparent shifter layer 22 of the present invention upon the transparent substrate 20, there is formed an attenuated Phase Shift Mask (PSM) blank of the preferred embodiments of the present invention. The attenuated Phase Shift Mask (PSM) blank of the preferred embodiments of the present invention is operational in the Near Ultra-Violet (NUV) (i.e.: 365 nm) wavelength region and the Deep Ultra-Violet (DUV) (i.e.: 248 nm) wavelength region while simultaneously being readily inspected and aligned with Helium-Neon laser light at 623 nm.

Referring now to FIG. 14, there is shown a cross-sectional schematic diagram of an attenuated Phase Shift Mask (PSM) which is formed through further processing of the attenuated Phase Shift Mask (PSM) blank of FIG. 13. Shown in FIG. 14 is the presence of a patterned semi-transparent shifter layer 22' which is formed through patterning through photolithographic and etching methods as are conventional in the art of the blanket semi-transparent shifter layer 22. When employed to print patterns through use of Near Ultra-Violet (NUV) (i.e.: 365 nm) wavelength light, the maximum aperture width within the patterned semi-transparent shifter layer 22' is preferably no wider than about 2000 angstroms. When employed to print patterns through the use of Deep Ultra-Violet (DUV) (i.e.: 248 nm) wavelength light, the maximum aperture width within the patterned semi-transparent shifter layer 22' is preferably no wider than about 1400 angstroms.

Upon forming the patterned semi-transparent shifter layer 22' from the blanket semi-transparent shifter layer 22, there is formed the attenuated Phase Shift Mask (PSM) of the preferred embodiments of the present invention. The attenuated Phase Shift Mask (PSM) of the preferred embodiments of the present invention is operational in the Near Ultra-Violet (NUV) (i.e.: 365) and the Deep Ultra-Violet (DUV) (i.e.: 248 nm) wavelength regions while simultaneously being readily inspected with Helium-Neon laser light of 623 nm.

EXAMPLE

An attenuated Phase Shift Mask (PSM) blank was formed upon a fused quartz glass substrate through methods and materials in accord with the methods and materials outlined for the preferred embodiments of the present invention. The fused quartz glass substrate was about 0.25 inch thick. Upon the fused quartz glass substrate was formed a blanket semi-transparent shifter layer from a tantalum-silicon oxide blanket layer of the formula,

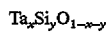

wherein $0.1 < x < 0.3$ and $0.03 < y < 0.1$. The tantalum-silicon oxide blanket semi-transparent shifter layer was formed through Physical Vapor Deposition (PVD) co-sputtering of a tantalum target and a crystalline silicon target in the presence of oxygen. The parameters under which the tantalum-silicon oxide blanket shifter layer was formed included a tantalum sputtering power of about 30 watts, a silicon sputtering power of about 60 watts, an argon gas flow of about 95 standard cubic centimeters per minute (sccm), an oxygen gas flow of about 5 standard cubic centimeters per minute (sccm) and a Physical Vapor Deposition (PVD) sputtering reactor chamber pressure of about 10 mTorr. The tantalum-silicon oxide blanket semi-transparent shifter layer which was formed through this method was about 1700 angstroms thick.

Figure 15:
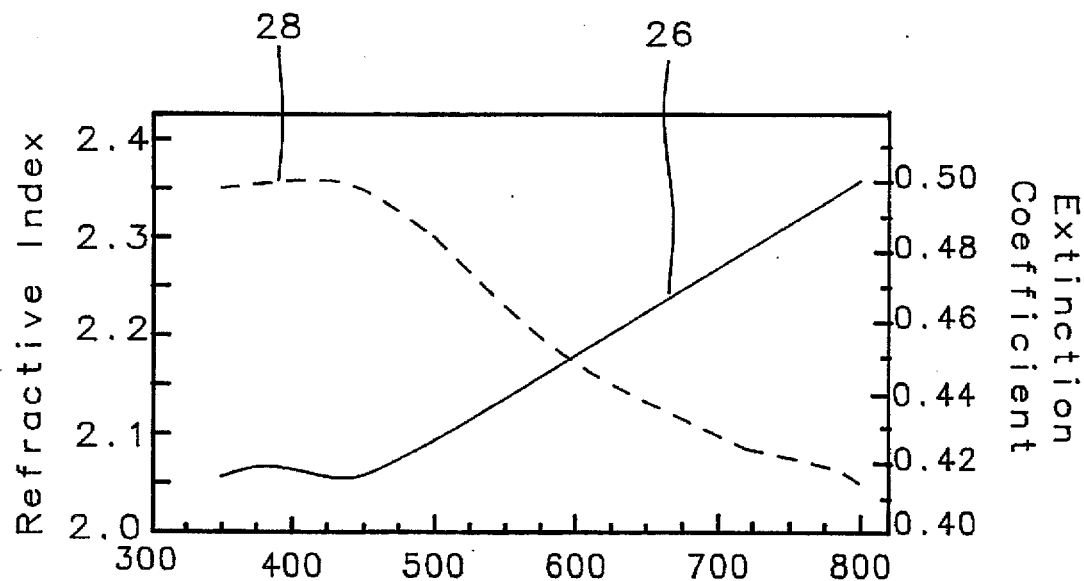
FIG. 15 shows a plot of Refractive Index and Extinction Coefficient versus Wavelength for an example of an attenuated Phase Shift Mask (PSM) blank formed in accord with the preferred embodiments of the present invention.
Figure 16:
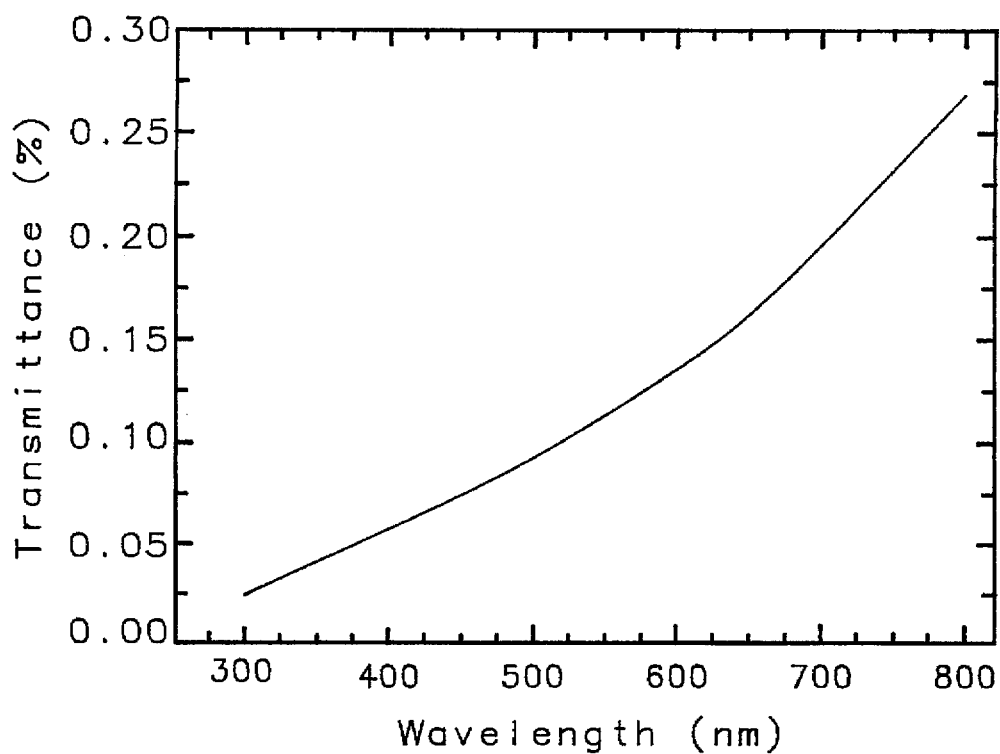
FIG. 16 shows a plot of Transmittance versus Wavelength for an example of an attenuated Phase Shift Mask (PSM) blank formed in accord with the preferred embodiments of the present invention.
Figure 17:
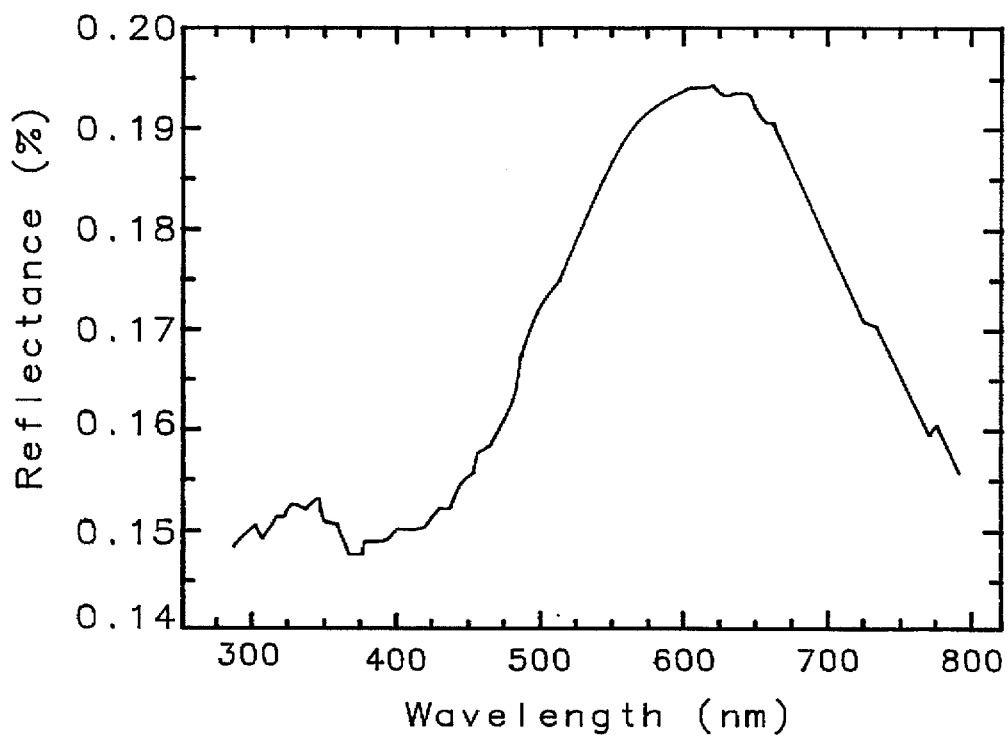
FIG. 17 shows a plot of Reflectance versus Wavelength for an example of an attenuated Phase Shift Mask (PSM) blank formed in accord with the preferred embodiments of the present invention.

After forming the tantalum-silicon oxide blanket semi-transparent shifter layer upon the surface of the transparent substrate to form the Phase Shift Mask (PSM) blank, the refractive index, the extinction coefficient, the light transmission and the light reflectance of the tantalum-silicon oxide blanket semi-transparent shifter layer were measured via ellipsometric and spectrophotometric optical techniques as are conventional to the art. A graph of Refractive Index and Extinction Coefficient versus Wavelength is shown in FIG. 15. Within FIG. 15, the Refractive Index is shown as curve 26 and the Extinction Coefficient is shown as curve 28. A graph of Light Transmittance versus Wavelength is shown in FIG. 16. Finally, a graph of Light Reflectance versus Wavelength is shown in FIG. 17. The results of these measurements, along with the preferred target values for these optical properties in the Near Ultra-Violet (NUV) (i.e.: 365 nm) wavelength region and the Deep Ultra-Violet (DUV) (i.e.: 248 nm) exposure wavelength regions, are listed in TABLE I. Also included in TABLE I is the value of the light transmittance of the attenuated Phase Shift Mask (PSM) blank of the preferred embodiments of the present invention at the 623 nm Helium-Neon laser light inspection and alignment wavelength.

TABLE I

| Optical Property | Target Value | Ta-Si Oxide Layer |
|---|---|---|
| Refract. Index (NUV/DUV) | 1.9–2.3 | approx. 2.0 |
| Extinct. Coeff. (NUV/DUV) | 0.35–0.55 | approx. 0.5 |
| Transmittance (NUV/DUV) | 3%–12% | approx. 5% |
| Transmittance (623 nm) | <20% | approx. 16% |
| Reflectance (NUV/DUV) | <20% | <15% |

From the data of TABLE I, it is seen that the optical properties of the attenuated Phase Shift Mask (PSM) blank which was formed with the tantalum-silicon oxide blanket semi-transparent shifter layer fall within the ranges desired for an operational attenuated Phase Shift Mask (PSM) blank or attenuated Phase Shift Mask (PSM) at Near Ultra-Violet (NUV) (i.e.: 365 nm) and Deep Ultra-Violet (DUV) (i.e.: 248 nm) exposure wavelengths, while simultaneously providing a sufficiently low light transmission at 623 nm to allow for easy inspection and alignment with Helium-Neon laser light at 623 nm.

As is understood by a person skilled in the art. The preferred embodiments and example of the Phase Shift Mask (PSM) blank and the Phase Shift Mask (PSM) of the present invention are illustrative of the present invention rather than limiting of the present invention. Revisions may be made to methods, materials structures and dimensions through which are formed the preferred embodiments and example of the Phase Shift Mask (PSM) blank and Phase Shift Mask (PSM) of the present invention while still forming a Phase Shift Mask (PSM) blank or Phase Shift Mask (PSM) within the spirit and scope of the present invention.

What is claimed is:

1. A method for forming an attenuated Phase Shift Mask (PSM) blank comprising:

providing a transparent substrate; and, forming upon the transparent substrate a tantalum-silicon oxide blanket semi-transparent shifter layer, the tantalum-silicon oxide blanket semi-transparent shifter layer having a formula, $$Ta_xSi_yO_{1-x-y}$$

wherein $0.10<x<0.3$ and $0.03<y<0.1$.

2. The method of claim 1 wherein the tantalum-silicon oxide blanket semi-transparent shifter layer has a thickness of about 1600 to about 2000 angstroms for exposure to Near Ultra-Violet (NUV) (i.e.: 365 nm) wavelength light.

3. The method of claim 1 wherein the tantalum-silicon oxide blanket semi-transparent shifter layer has a thickness of about 1000 to about 1400 angstroms for exposure to Deep Ultra-Violet (DUV) (i.e.: 248 nm) wavelength light.

4. The method of claim 1 wherein the tantalum-silicon oxide blanket semi-transparent shifter layer is formed through a co-sputtering of a tantalum target and a silicon target in an oxygen containing atmosphere.

5. A method for manufacturing an attenuated Phase Shift Mask (PSM) comprising:

providing a transparent substrate;

forming upon the transparent substrate a tantalum-silicon oxide blanket semi-transparent shifter layer, the tantalum-silicon oxide blanket semi-transparent shifter layer having a formula, $$Ta_xSi_yO_{1-x-y}$$

wherein $0.1<x<0.3$ and $0.03<y<0.1$; and, patterning the tantalum-silicon oxide blanket semi-transparent shifter layer to form a tantalum-silicon oxide patterned semi-transparent shifter layer.

6. The method of claim 5 wherein the tantalum-silicon oxide blanket semi-transparent shifter layer has a thickness of about 1600 to about 2000 angstroms for exposure to Near Ultra-Violet (NUV) (i.e.: 365 nm) wavelength light.

7. The method of claim 5 wherein the tantalum-silicon oxide blanket semi-transparent shifter layer has a thickness of about 1000 to about 1400 angstroms for exposure to Deep Ultra-Violet (DUV) (i.e.: 248 nm) wavelength light.

8. The method of claim 5 wherein the tantalum-silicon oxide blanket semi-transparent shifter layer is formed through a co-sputtering of a tantalum target and a silicon target in an oxygen containing atmosphere.

9. The method of claim 5 wherein the tantalum-silicon oxide patterned semi-transparent shifter layer has an aperture width of no greater than about 2000 angstroms for exposure to Near Ultra-Violet (NUV) (i.e.: 365 nm) wavelength light.

10. The method of claim 5 wherein the tantalum-silicon oxide patterned semi-transparent shifter layer has an aperture width of no greater than about 1400 angstroms for exposure to Deep Ultra-Violet (DUV) (i.e.: 248 nm) wavelength light.

11. An attenuated Phase Shift Mask (PSM) blank comprising:

a transparent substrate; and, a tantalum-silicon oxide blanket semi-transparent shifter layer upon the transparent substrate, the tantalum-silicon oxide blanket semi-transparent shifter layer having a formula, $$Ta_xSi_yO_{1-x-y}$$

wherein $0.1<x<0.3$ and $0.03<y<0.1$.

12. The attenuated Phase Shift Mask (PSM) blank of claim 11 wherein the tantalum-silicon oxide blanket semi-transparent shifter layer has a thickness of about 1600 to about 2000 angstroms for exposure to Near Ultra-Violet (NUV) (i.e.: 365 nm) wavelength light.

13. The attenuated Phase Shift Mask (PSM) blank of claim 11 wherein the tantalum-silicon oxide blanket semi-transparent shifter layer has a thickness of about 1000 to about 1400 angstroms for exposure to Deep Ultra-Violet (DUV) (i.e.: 248 nm) wavelength light.

14. An attenuated Phase Shift Mask (PSM) comprising:

a transparent substrate; and a tantalum-silicon oxide patterned semi-transparent shifter layer formed upon the transparent substrate, the tantalum-silicon oxide patterned semi-transparent shifter layer having a formula, $$Ta_xSi_yO_{1-x-y}$$

wherein $0.1<x<0.3$ and $0.03<y<0.1$.

15. The attenuated Phase Shift Mask (PSM) of claim 14 wherein the tantalum-silicon oxide patterned semi-transparent shifter layer has a thickness of about 1600 to about 2000 angstroms for exposure to Near Ultra-Violet (NUV) (i.e.: 365 nm) wavelength light.

16. The attenuated Phase Shift Mask (PSM) of claim 14 wherein the tantalum-silicon oxide patterned semi-transparent shifter layer has a thickness of about 1000 to about 1400 angstroms for exposure to Deep Ultra-Violet (DUV) (i.e.: 248 nm) wavelength light.

17. The attenuated Phase Shift Mask (PSM) of claim 14 wherein the tantalum-silicon oxide patterned semi-transparent shifter layer has an aperture width of no greater than about 2000 angstroms for exposure to Near Ultra-Violet (NUV) (i.e.: 365 nm) wavelength light.

18. The attenuated Phase Shift Mask (PSM) of claim 14 wherein the tantalum-silicon oxide patterned semi-transparent shifter layer has an aperture width of no greater than about 1400 angstroms for exposure to Deep Ultra-Violet (DUV) (i.e.: 248 nm) wavelength light.

* * * * *